(12) United States Patent
Tso et al.

(10) Patent No.: US 10,262,563 B2
(45) Date of Patent: Apr. 16, 2019

(54) LED DISPLAY

(71) Applicant: CHENG-CHANG TRANSFLEX DISPLAY CORP., Zhubei, Hsinchu County (TW)

(72) Inventors: Hui-Lan Tso, Zhubei (TW); Wen-Chang Fan, Zhubei (TW)

(73) Assignee: CHENG-CHANG TRANSFLEX DISPLAY CORP., Zhubei, Hsinchu County (TW)

( * ) Notice: Subject to any disclaimer, the term of this patent is extended or adjusted under 35 U.S.C. 154(b) by 22 days.

(21) Appl. No.: 15/819,543

(22) Filed: Nov. 21, 2017

(65) Prior Publication Data

US 2018/0090037 A1 Mar. 29, 2018

Related U.S. Application Data

(63) Continuation-in-part of application No. 15/210,786, filed on Jul. 14, 2016, now Pat. No. 9,865,646.

(51) Int. Cl.
| | |
|---|---|
| *H01L 23/14* | (2006.01) |
| *H01L 27/15* | (2006.01) |
| *G09F 9/30* | (2006.01) |
| *H01B 1/24* | (2006.01) |
| *H01L 51/00* | (2006.01) |
| *H01L 23/532* | (2006.01) |
| *H01L 33/62* | (2010.01) |
| *H01L 33/42* | (2010.01) |
| *H05K 3/46* | (2006.01) |

(Continued)

(52) U.S. Cl.
CPC ............... *G09F 9/301* (2013.01); *H01B 1/24* (2013.01); *H01L 23/14* (2013.01); *H01L 23/5328* (2013.01); *H01L 23/53276* (2013.01); *H01L 27/156* (2013.01); *H01L 33/42* (2013.01); *H01L 33/62* (2013.01); *H01L 51/0021* (2013.01); *H05K 3/4685* (2013.01); *F21K 9/20* (2016.08); *H01L 25/0753* (2013.01); *H01L 33/486* (2013.01); *H01L 2933/0066* (2013.01); *H05K 1/0289* (2013.01); *H05K 1/118* (2013.01); *H05K 1/189* (2013.01); *H05K 2201/0108* (2013.01); *H05K 2201/10106* (2013.01)

(58) Field of Classification Search
CPC ... H01L 27/156; H01L 23/14; H01L 23/5221; H01L 23/528; H01L 23/53242; H01L 23/5328; H01L 23/53276
See application file for complete search history.

(56) References Cited

U.S. PATENT DOCUMENTS

2007/0066078 A1* 3/2007 Kugler .................. B82Y 20/00
438/716
2009/0303426 A1 12/2009 Kim
(Continued)

*Primary Examiner* — Elias Ullah (74) *Attorney, Agent, or Firm* — Muncy, Geissler, Olds & Lowe, P.C.

(57) ABSTRACT

This application provides a LED display by utilizing flexible wires and the locations of the conductive pins on the bottom side of each single color LEDs or full color LEDs to make each of the single color LEDs or full color LEDs mount on each pixel defined by the flexible wires formed on a transparent substrate, and this LED display is characterized in separating the wires crossing with each other by a so-called bridge technology and utilizing a single-layered substrate to save costs of processes and materials.

13 Claims, 9 Drawing Sheets

(51) Int. Cl.
 *F21K 9/20* (2016.01)
 *H01L 33/48* (2010.01)
 *H01L 25/075* (2006.01)
 *H05K 1/11* (2006.01)
 *H05K 1/02* (2006.01)
 *H05K 1/18* (2006.01)

(56) References Cited

U.S. PATENT DOCUMENTS

2014/0353694 A1* 12/2014 Pang .................. H01L 25/0753
 257/89
2015/0041769 A1* 2/2015 Kim .................... H01L 51/0097
 257/40

\* cited by examiner

LED DISPLAY

CROSS-REFERENCE TO RELATED APPLICATION

This application is a continuation-in-part application claiming the benefit of U.S. non-provisional application Ser. No. 15/210,786, filed on Jul. 14, 2016, which claims the benefit of TW patent application Ser. No. 104,132,015 filed on Sep. 30, 2015 and TW patent application Ser. No. 104,215,650 filed on Sep. 30, 2015, and all of which are incorporated herein by reference in their entireties.

BACKGROUND

Field of the Invention

The present invention relates to a matrix display, and in particular relates to a LED display.

Description of Related Art

Recently, a flexible display made of plastic and having light weight and anti-shock properties have been developed. The portability can be maximized by folding or rolling up the flexible display. Meanwhile, this flexible display can be used in many fields such as electronic billboards, window banners, exhibition bulletin boards, and so on.

A conventional flexible display comprises a display device formed on a flexible substrate, wherein various display device can be chosen, such as OLED, LCD or EPD. The displays mentioned above usually comprise thin film transistors, so lots of thin film processes are necessary to form thin film transistors on a flexible substrate to generate a flexible display device. However, the flexible substrate having a thickness of about tens nm is too thin to proceed various thin film processes. Currently, a new method of manufacturing a flexible display was provided, wherein a flexible substrate was formed on a glass substrate in advance, then a display device was formed on the flexible substrate adhered on the glass substrate, then the flexible substrate and the glass substrate was separated. The thermal expansion coefficients (CTE) of the flexible substrate made of plastic materials and the glass substrate are different. The flexible substrate and the glass substrate can be easily separated or bended during high temperature process when the bonding force therebetween is weak and results in serious defects. In addition, the conventional single-layered or double-layered flexible LED display is restricted in the wiring design, so the single color (two conductive pad) LEDs are chosen instead of full color LEDs for full color display. Accordingly, the applications of LED displays are still not popular.

In accordance, a new and convenient method of manufacturing a full color flexible display which can overcome above disadvantages is highly expected. This present invention provides a flexible LED display by utilizing flexible wires and the locations of the conductive pins on the bottom side of each single color LEDs or full color LEDs to make each of the single color LEDs or full color LEDs mount on each pixel defined by the flexible wires formed on the transparent flexible substrate. Furthermore, this present invention provides a flexible LED display characterized in separating the wires crossing with each other by a so-called bridge technology and utilizing a single-layered substrate to save costs of processes and materials.

SUMMARY

In one embodiment, a disclosed LED display may include a substrate; a plurality of columns of first wires and a plurality of rows of second wires formed on the substrate, wherein the first wires cross the second wires to define a plurality of pixels, and the first wires and the second wires are insulated at the intersections of the first wires and the second wires; a plurality of LED packages each mounted within one of the pixels; a first circuit connected to the first wires; a second circuit connected to the second wires; and a driving circuit connected to the first circuit and the second circuit.

In one embodiment, the substrate may be flexible and selected from the group consisting of Polyethylene terephthalate (PET), Poly (methyl methacrylate) (PMMA), Polyimide (PI), Polycarbonate (PC), glass and combination thereof.

In one embodiment, the substrate may be rigid and selected from the group consisting of polyethylene terephthalate (PET), poly (methyl methacrylate) (PMMA), glass and combination thereof.

In one embodiment, the first wires and the second wires may be formed on the same surface of the substrate.

In one embodiment, the first wires and the second wires may be formed on the same plane except at the intersections of the first wires and the second wires.

In one embodiment, the LED display may further include a plurality of insulating layers sandwiched between the first wires and the second wires at the intersections of the first wires and the second wires.

In one embodiment, the first wires and the second wires may respectively be formed on the opposite surfaces of the substrate.

In one embodiment, the LED display may further include a plurality of conductive holes through the substrate, and the first wires or the second wires may include a plurality of extension parts connected to the conductive holes.

In one embodiment, the LED display may further include a plurality of conductive pads and a plurality of conductive holes through the substrate, and the conductive pads may be connected to the first wires or the second wires by the conductive holes.

In one embodiment, adjacent three of the first wires and one of the second wires may define one of the pixels.

In one embodiment, the pixel defined by adjacent three of the first wires and one of the second wires may include three sub-pixels each defined by one of the first wires and one of the second wires, and one of the LED packages may include three LED units designed to each emit different emission spectrum, and the LED units may be respectively mounted within the sub-pixels.

In one embodiment, adjacent two of the first wires and adjacent two of the second wires may define one of the pixels.

In one embodiment, the pixel defined by adjacent two of the first wires and adjacent two of the second wires may include four sub-pixels each defined by one of the first wires and one of the second wires, and one of the LED packages may include four LED units designed to each emit different emission spectrum, and the LED units may be respectively mounted within the sub-pixels.

BRIEF DESCRIPTION OF DRAWINGS

FIG. 1A' illustrates the top-view of the flexible LED display according to the embodiment 2.

DETAILED DESCRIPTION OF THE EMBODIMENTS

Embodiment 1

Figure 1A:
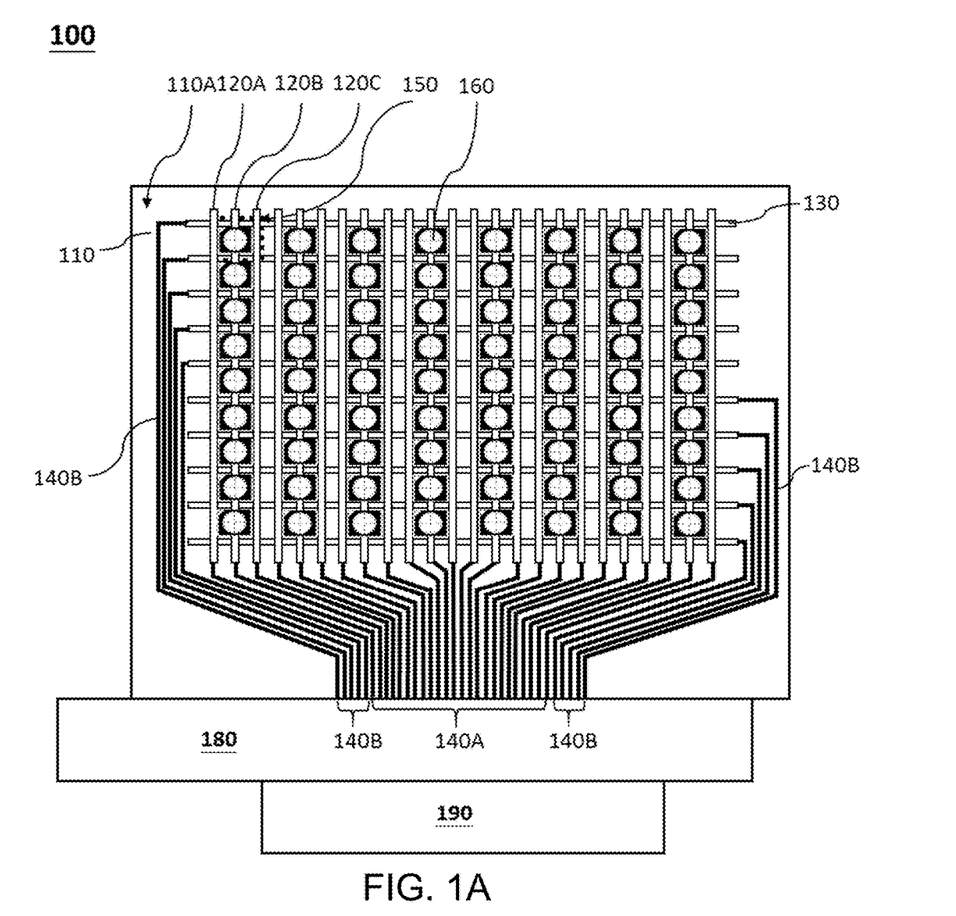
FIG. 1A illustrates the top-view of the flexible LED display according to the embodiment 1.

First, please refer to FIG. 1A which illustrates the top-view of the flexible LED display 100 according to the embodiment 1. As shown in FIG. 1A, the LED display 100 comprises a transparent flexible substrate 110 having a top surface 110A and a bottom surface opposite to each other, which can be selected from the group consisting of Polyethylene terephthalate (PET), Poly (methyl methacrylate) (PMMA), Polyimide (PI), Polycarbonate (PC), glass and combination thereof. The transparent flexible substrate 110 of this embodiment is preferred to be consisted of PET.

M columns of first flexible wires 120A, M columns of the first flexible wires 120B, and M columns of the first flexible wires 120C are alternatively formed in parallel on the top surface 110A of the transparent flexible substrate 110, and N rows of second flexible wires 130 are formed on the top surface 110A of the transparent flexible substrate 110 and cross the first flexible wires 120A, 120B and 120C to define M*N pixels 150, wherein M and N are both natural numbers. In another embodiment of the invention, the substrate could be rigid and for example, made of polyethylene terephthalate (PET), poly (methyl methacrylate) (PMMA), glass or combination thereof. The wires also could be formed on the surface of the rigid substrate.

Besides, the first flexible wires 120A, 120B and 120C are electrically connected to the flexible print circuit board (FPC) 180 via the first fan-shaped circuit 140A to connect the driving circuit (not shown) on the driver IC units and control circuit units 190, and the second flexible wires 130 are electrically connected to the flexible print circuit board (FPC) 180 via the second fan-shaped circuit 140B to connect the driving circuit (not shown) having driver ICs and control units on the control board 190.

The first flexible wires 120A, 120B and 120C, and the second flexible wires 130 can be selected from the group consisting of gold wire, silver wire, silver slurry, copper wire, carbon nanotube, poly-(3,4-ethylenedioxy thiophene)-polystyrene sulfonic acid (PEDOT), nano silver and combination thereof. The first flexible wires 120A, 120B and 120C, and the second flexible wires 130 of this embodiment are consisted of carbon nanotube.

Figure 1B:
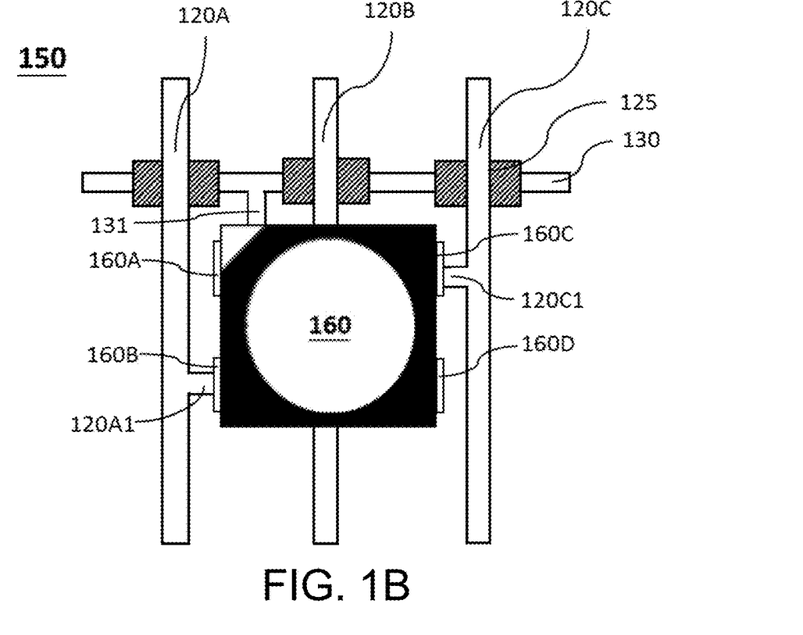
FIGS. 1B~1C illustrate the enlarged views of one of the pixels 150 as shown in FIG. 1A.
Figure 1C:
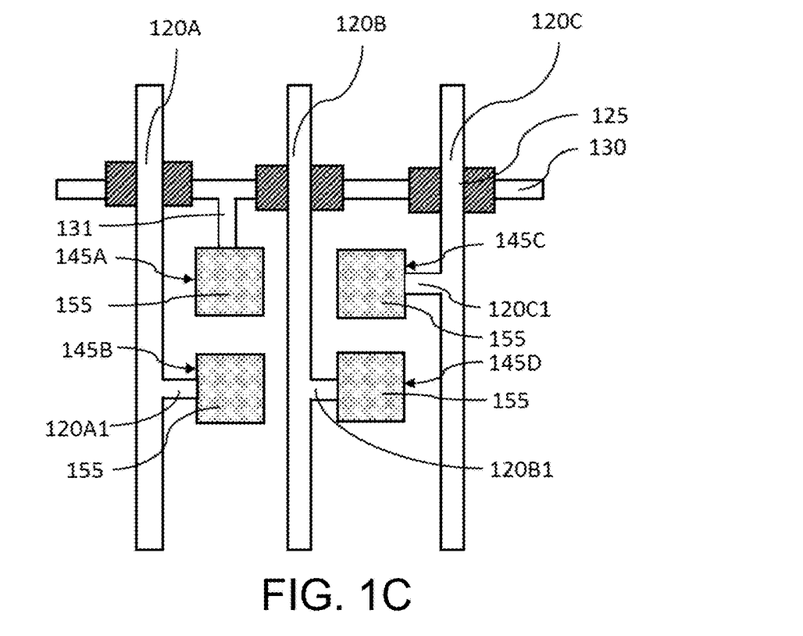

Next, please refer to FIGS. 1B and 1C which illustrate the enlarged views of one of the pixels 150 as shown in FIG. 1A. As illustrated in FIG. 1B, the pixel 150 is addressed by the (i), (i+1) and (i+2) columns of the first flexible wires 120A, 120B and 120C, and the (j) row of the second flexible wire 130, wherein the (i) column of the first flexible wire 120A is depicted on the left side of each LED package 160, the (i+2) column of the first flexible wire 120C is depicted on the right side of each LED package 160, and the (i+1) column of the first flexible wire 120B is depicted under each LED package 160. A LED package 160 emitting red, green, blue light or mixture thereof is mounted within the pixel 150, wherein i and j are both natural numbers, and $1 \leq i \leq 3M-2$, $1 \leq j \leq N$. Besides, as shown in FIG. 1C, insulating layers 125 are respectively sandwiched between the first flexible wires 120A, 120B, 120C and the second flexible wire 130 at the intersections thereof. In another embodiment, the first flexible wires and the second flexible wires are on the same plane except at the intersections thereof. Furthermore, the insulating layer 125 can be a single-layered or a double-layered insulating material (not shown) to avoid disconnection owing to the height gap of the first flexible wires 120A, 120B, 120C across each of the second flexible wires 130. Alternatively, the insulating layer 125 can also overall overlay each of the second flexible wires 130 in other embodiments of this invention (not shown).

Each of the LED packages 160 comprises a plurality of LED units (not shown) designed to respectively emit red, green, or blue emission spectrum. The LED units of this embodiment are LED chips respectively emitting red, green or blue emission. In addition, the non-emitting bottom side (not shown) of each LED package 160 comprises a first conductive pin 160A, a second conductive pin 160B, a third conductive pin 160C and a fourth conductive pin 160D. A LED unit emitting suitable visible emission spectrum other than red, green and blue emission spectrums can also be selected as one of the LED units of the LED package 160. The arrangement of these LED units inside the LED package 160 can be adjusted as needed.

As illustrated in FIGS. 1B~1C, the (j) row of the second flexible wire 130 has a first extension part 131 connected to a first conductive pad 145A, and the (i) column of the first flexible wire 120A has a second extension part 120A1 connected to a second conductive pad 145B, and the (i+1) column of the first flexible wire 120B has a fourth extension part 120B1 connected to a fourth conductive pad 145D, and the (i+2) column of the first flexible wire 120C has a third extension part 120C1 connected to a third conductive pad 145C, whereby the first conductive pin 160A of the LED package 160 is electrically connected to the (j) row of the second flexible wire 130 by connecting the first conductive pad 145A by means of the conductive glue 155 cured at a temperature lower than 250 degree C.; the second conductive pin 160B of the LED package 160 is electrically connected to the (i) column of the first flexible wire 120A by connecting the second conductive pad 145B by means of the conductive glue 155 cured at a temperature lower than 250 degree C.; the third conductive pin 160C of the LED package 160 is electrically connected to the (i+2) column first flexible wire 120C by connecting the third conductive pad 145C by means of the conductive glue 155 cured at a temperature lower than 250 degree C.; and the fourth conductive pin 160D of the LED package 160 is electrically connected to the (i+1) column first flexible wire 120B by connecting the fourth conductive pad 145D by means of the conductive glue 155 cured at a temperature lower than 250 degree C. Furthermore, the conductive glue 155 can also be used together with an anisotropic conductive film (ACF) (not shown) or replaced with the anisotropic conductive film (ACF) (not shown) in other embodiments of this invention.

Accordingly, a flexible LED display with a high density array according to this embodiment 1 can be easily manufactured by forming flexible wires on a transparent flexible substrate and mounting each of full color LED packages within each of pixels defined by the flexible wires.

Embodiment 2

First, please refer to FIG. 1A' which illustrates the top-view of the flexible LED display 100' according to the embodiment 2. As shown in FIG. 1A', the LED display 100' comprises a transparent flexible substrate 110 having a top surface 110A and a bottom surface 110B opposite to each other, which can be selected from the group consisting of Polyethylene terephthalate (PET), Poly (methyl methacrylate) (PMMA), Polyimide (PI), Polycarbonate (PC), glass and combination thereof. The transparent flexible substrate 110 of this embodiment is preferred to be consisted of PET.

M columns of first flexible wires 120A, M columns of the first flexible wires 120B, and M columns of the first flexible wires 120C are alternatively formed in parallel on the top surface 110A of the transparent flexible substrate 110, and N rows of second flexible wires 130 are formed on the top surface 110A of the transparent flexible substrate 110 and cross the first flexible wires 120A, 120B and 120C to define M*N pixels 150, wherein M and N are both natural numbers.

Besides, the first flexible wires 120A, 120B and 120C are electrically connected to the flexible print circuit board (FPC) 180 via the first fan-shaped circuit 140A to connect the driving circuit (not shown) on the driver IC units and control circuit units 190, and the second flexible wires 130 are electrically connected to the flexible print circuit board (FPC) 180 via the second fan-shaped circuit 140B to connect the driving circuit (not shown) having driver ICs and control units on the control board 190.

The first flexible wires 120A, 120B and 120C, and the second flexible wires 130 can be selected from the group consisting of gold wire, silver wire, silver slurry, copper wire, carbon nanotube, poly-(3,4-ethylenedioxy thiophene)-polystyrene sulfonic acid (PEDOT), nano silver and combination thereof. The first flexible wires 120A, 120B and 120C, and the second flexible wires 130 of this embodiment are consisted of carbon nanotube.

Next, please refer to FIGS. 1B' and 1C' which illustrate the enlarged views of one of the pixels 150 as shown in FIG. 1A'. As shown in FIG. 1B', the pixel 150 is addressed by the (i), (i+1) and (i+2) columns of the first flexible wires 120A, 120B and 120C, and the (j) row of the second flexible wire 130, wherein the (i) column of the first flexible wire 120A is depicted on the left side of each LED package 160, the (i+1) and (i+2) columns of the first flexible wire 120B and 120C are depicted on the right side of each LED package 160. A LED package 160 emitting red, green, blue light or mixture thereof is mounted within each pixel 150, wherein i and j are both natural numbers, and 1≤i≤3M−2, 1≤j≤N. Besides, an insulating layer 125 is formed to overall overlay each of the second flexible wires 130.

The difference between the embodiments 1 and 2 is the first flexible wire 120B of embodiment 2 is depicted on the right side of the LED package 160 instead of depicting under the LED package 160 as that of embodiment 1. In addition, the insulating layer 125' of this embodiment is a double-layered structure including a first insulating layer 125A and a second insulating layer 125B formed on the first insulating layer 125A, and the vertical projection area of the second insulating layer 125B is smaller than that of the first insulating layer 125A. The insulating layer 125' can also be a single-layered structure (not shown) or sandwiched at the intersections of the first flexible wires 120A, 120B, 120C and the second flexible wires 130 in other embodiments of this invention.

Each of the LED packages 160 comprises various LED units (not shown) designed to respectively emit red, green, or blue emission spectrum. The LED units of this embodiment are LED chips respectively emitting red, green or blue emission. In addition, the non-emitting bottom side (not shown) of each LED package 160 comprises a first conductive pin 160A, a second conductive pin 160B, a third conductive pin 160C and a fourth conductive pin 160D. A LED unit emitting suitable visible emission spectrum other than red, green and blue emission spectrums can also be selected as one of the LED units of the LED package 160. The arrangement of these LED units inside the LED package 160 can be adjusted as needed.

As illustrated in FIGS. 1B'~1C', the (j) row of the second flexible wire 130 has a first extension part 131 connected to a first conductive pad 145A, and the (i) column of the first flexible wire 120A has a second extension part 120A1 connected to a second conductive pad 145B, and the (i+1) column of the first flexible wire 120B has a fourth extension part 120B1 connected to a fourth conductive pad 145D, and the (i+2) column of the first flexible wire 120C has a third extension part 120C1 connected to a third conductive pad 145C, whereby the first conductive pin 160A of the LED package 160 is electrically connected to the (j) row of the second flexible wire 130 by connecting the first conductive pad 145A by means of the conductive glue 155 cured at a temperature lower than 250 degree C.; the second conductive pin 160B of the LED package 160 is electrically connected to the (i) column of the first flexible wire 120A by connecting the second conductive pad 145B by means of the conductive glue 155 cured at a temperature lower than 250 degree C.; the third conductive pin 160C of the LED package 160 is electrically connected to the (i+2) column first flexible wire 120C by connecting the third conductive pad 145C by means of the conductive glue 155 cured at a temperature lower than 250 degree C.; and the fourth conductive pin 160D of the LED package 160 is electrically connected to the (i+1) column first flexible wire 120B by connecting the fourth conductive pad 145D by means of the conductive glue 155 cured at a temperature lower than 250 degree C. Furthermore, the conductive glue 155 can also be used together with the anisotropic conductive film (ACF) or replaced with the anisotropic conductive film (ACF) in other embodiments of this invention. A dielectric layer 126 is sandwiched between the third extension part 120C1 of the first flexible wire 120C and the first flexible wire 120B at the intersection thereof, wherein the dielectric layer 126 of this embodiment is a double-layered structure including a first dielectric layer 126A and a second dielectric layer 126B, and the vertical projection area of the second dielectric layer 126B is smaller than that of the first dielectric layer 126A. The dielectric layer 126 of other embodiments of this invention can also be a single-layered structure. Furthermore, the conductive glue 155 can also be used together with an anisotropic conductive film (ACF) (not shown) or replaced with the anisotropic conductive film (ACF) (not shown) in other embodiments of this invention.

Accordingly, a flexible LED display with a high density array of this embodiment 2 can be easily manufactured by forming flexible wires on a transparent flexible substrate and mounting each of full color LED packages in each of pixels defined by the flexible wires.

Embodiment 3

Figure 2A:
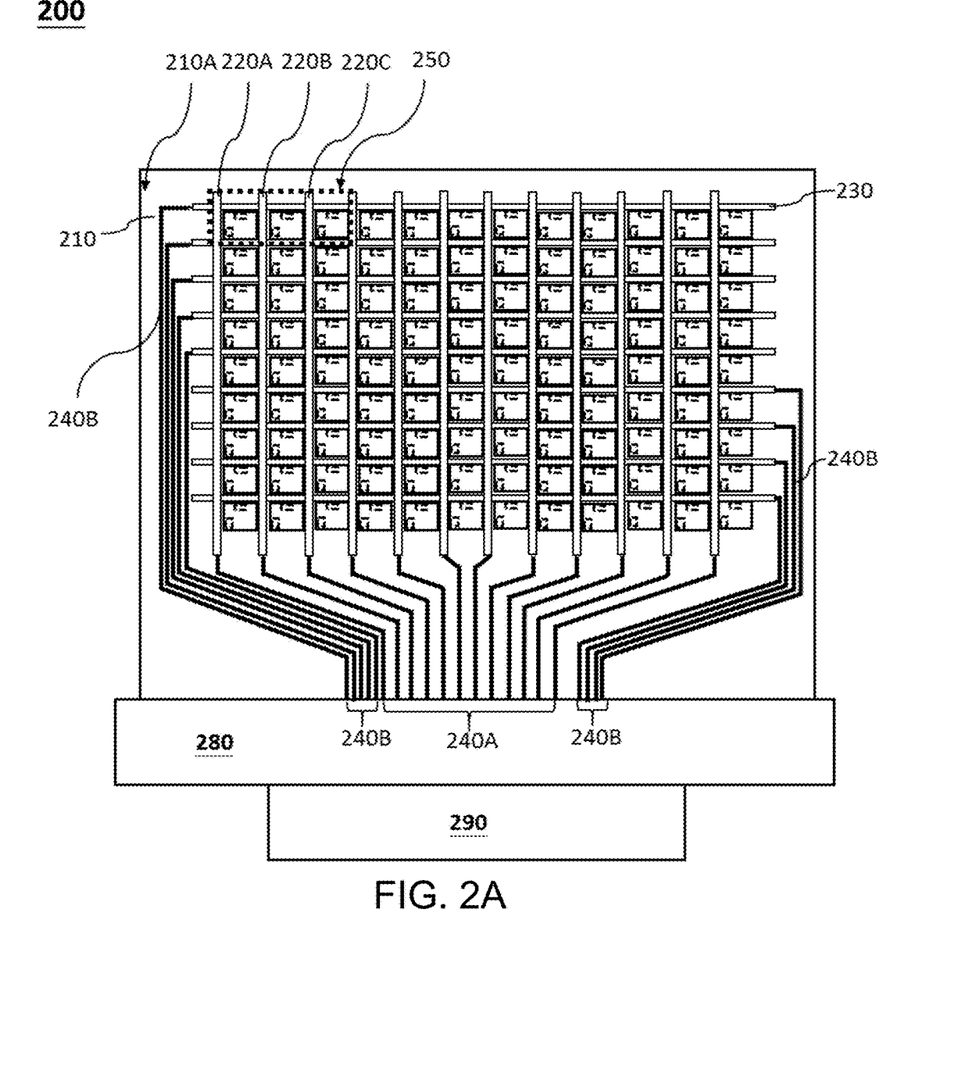
FIG. 2A illustrates the top-view of the flexible LED display according to the embodiment 3.

First, please refer to FIG. 2A which illustrates the top-view of the flexible LED display according to the embodiment 3. As shown in FIG. 2A, the LED display 200 comprises a transparent flexible substrate 210 having a top surface 210A and a bottom surface 210B opposite to each other, which can be selected from the group consisting of Polyethylene terephthalate (PET), Poly (methyl methacrylate) (PMMA), Polyimide (PI), Polycarbonate (PC), glass and combination thereof. The transparent flexible substrate 210 of this embodiment is preferred to be consisted of PET.

P columns of first flexible wires 220A, P columns of the first flexible wires 220B, and P columns of the first flexible wires 220C are alternatively formed in parallel on the top surface 210A of the transparent flexible substrate 210, and Q rows of second flexible wires 230 are formed on the top surface 210A of the transparent flexible substrate 210 and cross the first flexible wires 220A, 220B and 220C to define P*Q pixels 250, wherein P and Q are both natural numbers.

Besides, the first flexible wires 220A, 220B and 220C are electrically connected to the flexible print circuit board (FPC) 280 via the first fan-shaped circuit 240A to connect the driving circuit (not shown) on the driver IC units and control circuit units 290, and the second flexible wires 230 are electrically connected to the flexible print circuit board (FPC) 280 via the second fan-shaped circuit 240B to connect the driving circuit (not shown) having driver ICs and control units on the control board 290.

The first flexible wires 220A, 220B and 220C, and the second flexible wires 230 can be selected from the group consisting of gold wire, silver wire, silver slurry, copper wire, carbon nanotube, poly-(3,4-ethylenedioxy thiophene)-polystyrene sulfonic acid (PEDOT), nano silver and combination thereof. The first flexible wires 220A, 220B and 220C, and the second flexible wires 230 of this embodiment are consisted of carbon nanotube.

Figure 2B:
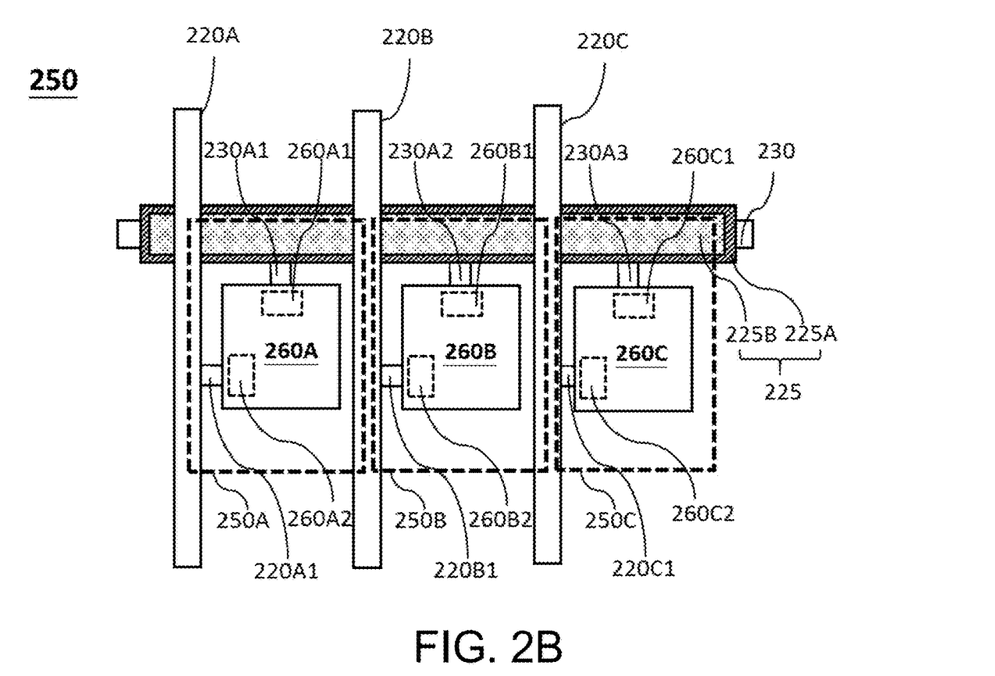
FIGS. 2B~2C illustrate the enlarged views of one of the pixels 250 as shown in FIG. 2A.
Figure 2C:
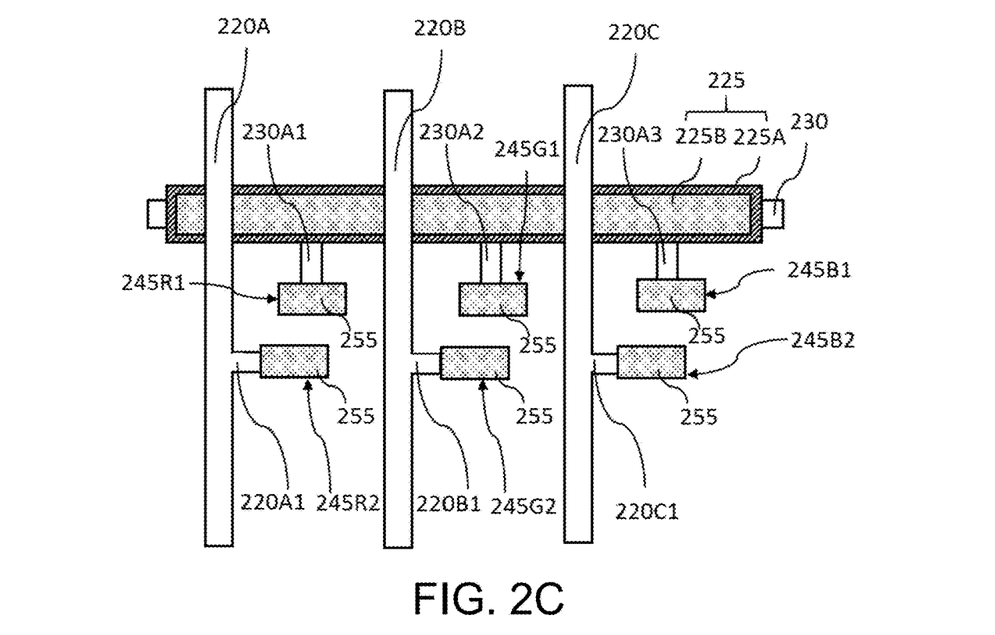

Next, please refer to FIGS. 2B and 2C which illustrate the enlarged views of one of the pixels 250 as shown in FIG. 2A. As illustrated in FIG. 2B, each pixel 250 includes a first sub-pixel 250A addressed by the (r) column of the first flexible wires 220A and the (s) row of the second flexible wire 230; a second sub-pixel 250B addressed by the (r+1) column of the first flexible wires 220B and the (s) row of the second flexible wire 230; and a third sub-pixel 250C addressed by the (r+2) column of the first flexible wires 220C and the (s) row of the second flexible wire 230, whereby r, s are both natural numbers, and $1 \leq r \leq 3P-2$, $1 \leq s \leq Q$.

As illustrated in FIGS. 2B and 2C, each of the second flexible wires 230 is overlaid by an insulating layer 225 to insulate the first flexible wires 220A, 220B and 220C. The insulating layer 225 is a double-layered structure including a first insulating layer 225A and a second insulating layer 225B formed on the first insulating layer 225B, and the vertical projection area of the second insulating layer 225B is smaller than that of the first insulating layer 225A. The insulating layer 225 of other embodiments of this invention can also be a single-layered structure (not shown) or sandwiched at the intersections (not shown) of the first flexible wires 220A, 220B, 220C and the second flexible wire 230.

Next, a plurality of first LEDs 260A are provided and mounted within each first sub-pixel 250A, whereby each of the first LEDs 260A has a fifth conductive pin 260A1 and a sixth conductive pin 260A2 on its non-emitting side (not shown). A plurality of second LEDs 260B are provided and mounted within each second sub-pixel 250B, whereby each of the second LEDs 260B has a seventh conductive pin 260B1 and a eighth conductive pin 260B2 on its non-emitting side (not shown). A plurality of third LEDs 260C are provided and mounted within each third sub-pixel 250C, whereby each of the third LEDs 260C has a ninth conductive pin 260C1 and a tenth conductive pin 260C2 on its non-emitting side (not shown).

The first LEDs 260A of this embodiment are red LED packages; the second LEDs 260B of this embodiment are green LED packages; and the third LEDs 260C of this embodiment are blue LED packages. The first LEDs 260A, the second LEDs 260B and the third LEDs 260C of other embodiments of this invention can be selected from LED packages emitting visible spectrum other than red, green and blue emission spectrum, and the arrangement of these LED packages can be adjusted as needed. Furthermore, the first LEDs 260A, the second LEDs 260B and the third LEDs 260C can also be replaced with red LED flip chips, green LED flip chips and blue LED flip chips, and the arrangement of these LED flip chips can also be adjusted as needed.

As illustrated in FIGS. 2B and 2C, the (s) row of the second flexible wire 230 has a fifth extension part 230A1 connected to a fifth conductive pad 245R1, and the (r) column of the first flexible wire 220A has a sixth extension part 220A1 connected to a sixth conductive pad 245R2, whereby the fifth conductive pin 260A1 of the first LED 260A is electrically connected to the (s) row of the second flexible wire 230A by connecting the fifth conductive pad 245R1 by means of a conductive glue 255 cured at a temperature lower than 250 degree C., and the sixth conductive pin 260A2 is electrically connected to the (r) column of the first flexible wire 220A by connecting the sixth conductive pad 245R2 by means of a conductive glue 255 cured at a temperature lower than 250 degree C.; the (s) row of the second flexible wire 230 has a seventh extension part 230A2 connected to a seventh conductive pad 245G1, and the (r+1) column of the first flexible wire 220B has an eighth extension part 220B1 connected to an eighth conductive pad 245G2, wherein the seventh conductive pin 260B1 is electrically connected to the (s) row of the second flexible wire 230 by connecting the seventh conductive pad 245G1, and the eighth conductive pin 260B2 is electrically connected to the (r+1) column of the first flexible wire 220B by connecting the eighth conductive pad 245G2 by means of a conductive glue 255 cured at a temperature lower than 250 degree C.; and the (s) row of the second flexible wire 230 has a ninth extension part 230A3 connected to a ninth conductive pad 245B1, and the (r+2) column of the first flexible wire 220C has a tenth extension part 220C1 connected to a tenth conductive pad 245B2, wherein the ninth conductive pin 260C1 is electrically connected to the (s) row of the second flexible wire 230 by connecting the ninth conductive pad 245B1 by means of a conductive glue 255 cured at a temperature lower than 250 degree C., and the tenth conductive pin 260C2 is electrically connected to the (r+2) column of the first flexible wire 220C by connecting the tenth conductive pad 245B2 by means of a conductive glue 255 cured at a temperature lower than 250 degree C. Furthermore, the conductive glue 255 can also be used together with an anisotropic conductive film (ACF) (not shown) or replaced with the anisotropic conductive film (ACF) (not shown) in other embodiments of this invention.

Accordingly, a flexible LED display with a high density array of this embodiment 3 can be easily manufactured by forming flexible wires on a transparent flexible substrate and mounting each of red, green and blue LED packages or flip chips in each of pixels defined by the flexible wires.

Embodiment 4

Figure 3A:
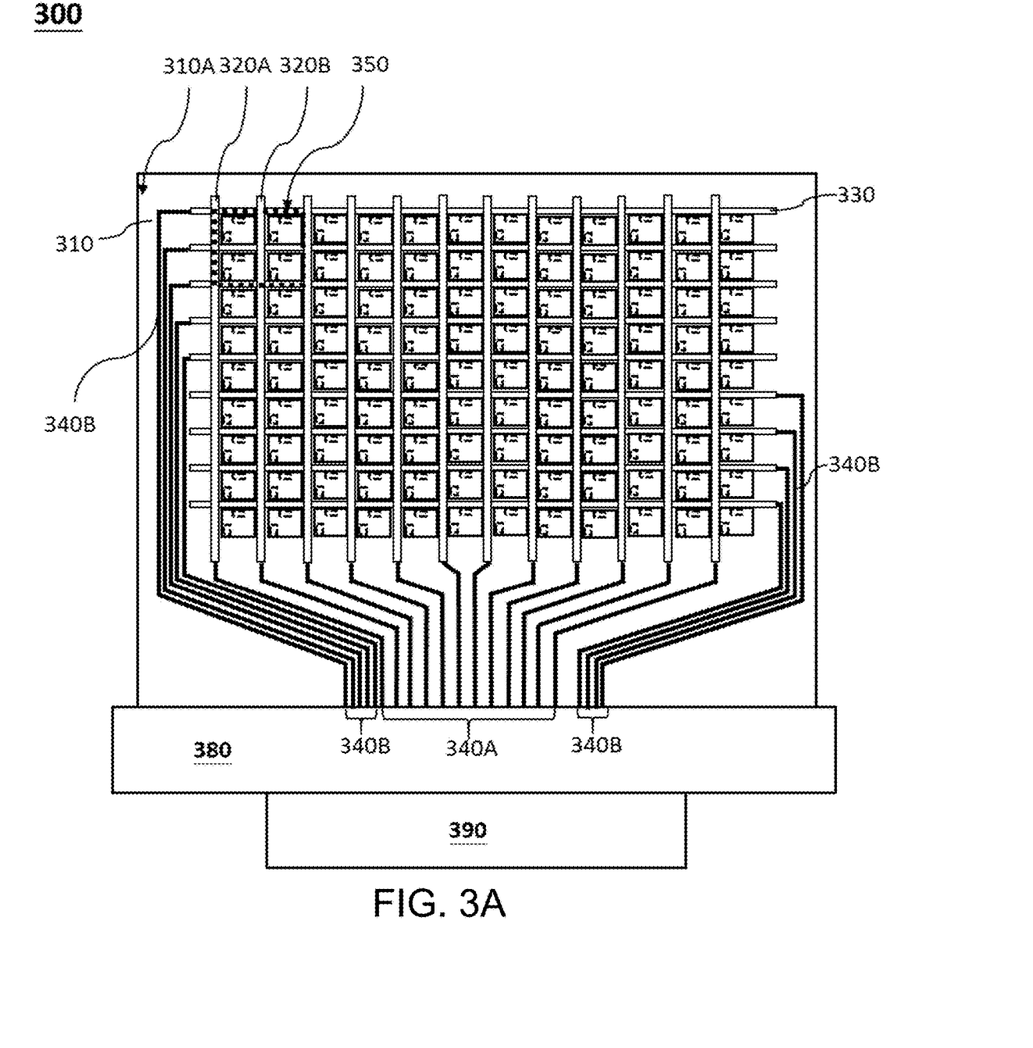
FIG. 3A illustrates the top-view of the flexible LED display according to the embodiment 4.

First, please refer to FIG. 3A which illustrates the top-view of the flexible LED display 300 according to the embodiment 4. As illustrated in FIG. 3A, the LED display 300 comprises a transparent flexible substrate 310 having a top surface 310A and a bottom surface 310B opposite to each other, which can be selected from the group consisting of Polyethylene terephthalate (PET), Poly (methyl methacrylate) (PMMA), Polyimide (PI), Polycarbonate (PC), glass and combination thereof. The transparent flexible substrate 310 of this embodiment is preferred to be consisted of PET.

Columns of first flexible wires 320A and columns of the second flexible wires 320B are alternatively formed in parallel on the top surface 310A of the transparent flexible substrate 310, and B rows of second flexible wires 330A and B rows of second flexible wires 330B are alternatively formed in parallel on the top surface 310A of the transparent flexible substrate 310 and cross the first flexible wires 320A and 320B to define A*B pixels 350, wherein A and B are both natural numbers.

Besides, the first flexible wires 320A and 320B are electrically connected to the flexible print circuit board (FPC) 380 via the first fan-shaped circuit 340A to connect the driving circuit (not shown) on the driver IC units and control circuit units 390, and the second flexible wires 330A and 330B are electrically connected to the flexible print circuit board (FPC) 380 via the second fan-shaped circuit 340B to connect the driving circuit (not shown) having driver ICs and control units on the control board 390.

The first flexible wires 320A and 320B, and the second flexible wires 330A and 330B can be selected from the group consisting of gold wire, silver wire, silver slurry, copper wire, carbon nanotube, poly-(3,4-ethylenedioxy thiophene)-polystyrene sulfonic acid (PEDOT), nano silver and combination thereof. The first flexible wires 320A and 320B, and the second flexible wires 330A and 330B of this embodiment are consisted of carbon nanotube.

Figure 3B:
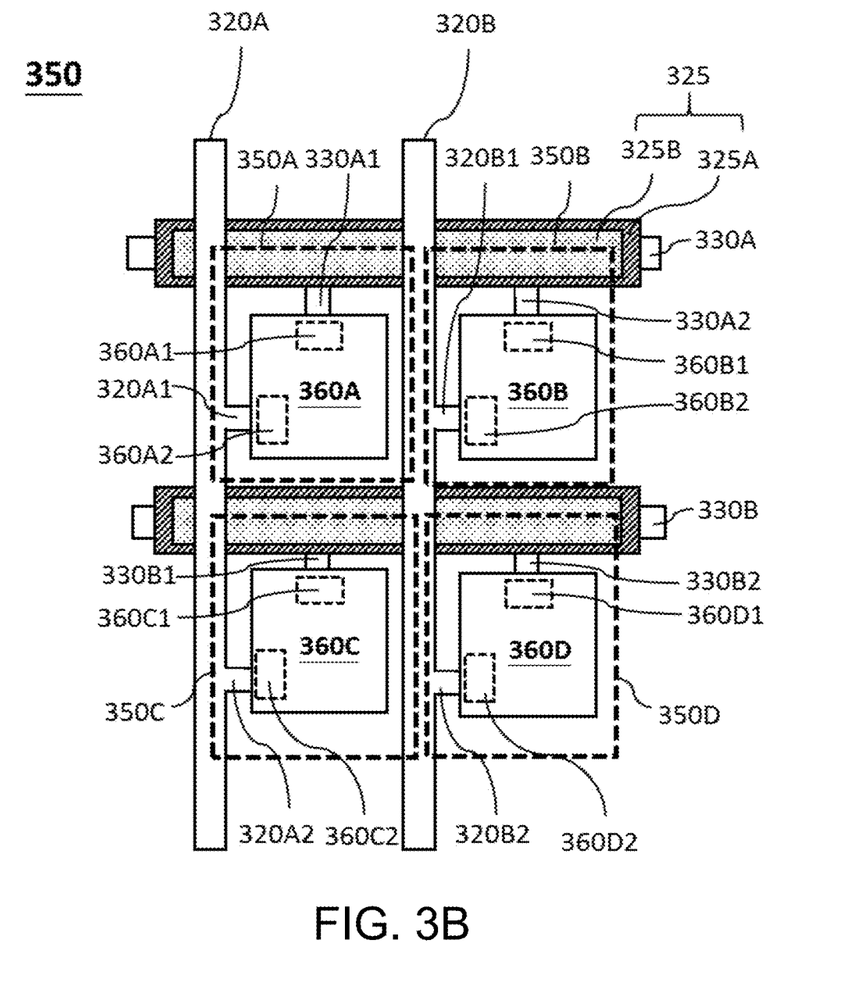
FIGS. 3B~3C illustrate the enlarged views of one of the pixels 350 as shown in FIG. 3A.
Figure 3C:
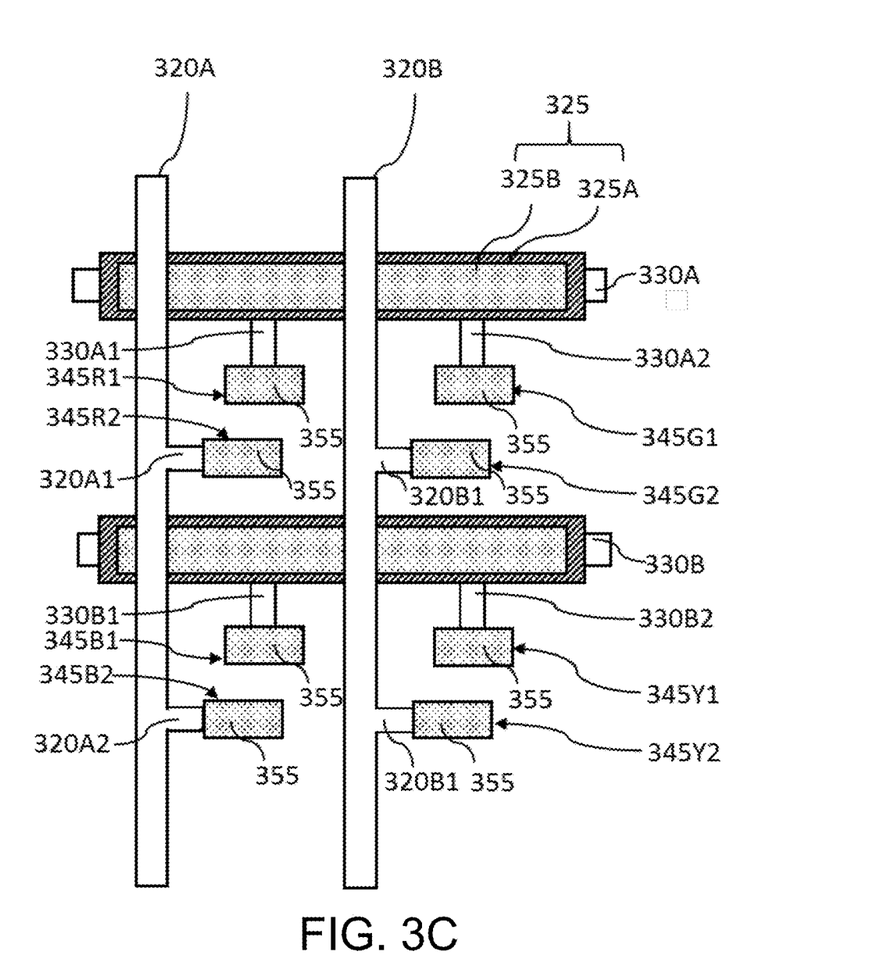

Next, please refer to FIGS. 3B and 3C which illustrate the enlarged views of one of the pixels 350 as shown in FIG. 3A. As illustrated in FIG. 3B, each pixel 350 includes a first sub-pixel 350A addressed by the (d) column of the first flexible wires 320A and the (e) row of the second flexible wire 330A; a second sub-pixel 350B addressed by the (d+1) column of the first flexible wires 320B and the (e) row of the second flexible wire 330A; and a third sub-pixel 350C addressed by the (d) column of the first flexible wires 320A and the (e+1) row of the second flexible wire 330B; and a fourth sub-pixel 350D addressed by the (d+1) column of the first flexible wires 320B and the (e+1) row of the second flexible wire 330B, whereby d and e are both natural numbers, and $1 \le d \le 2A-1$, $1 \le e \le 2B-1$.

Each of the second flexible wires 330A and 330B is overlaid by an insulating layer 325 to insulate the first flexible wires 320A and 320B. The insulating layer 325 is a double-layered structure including a first insulating layer 325A and a second insulating layer 325B formed on the first insulating layer 325B, and the vertical projection area of the second insulating layer 325B is smaller than that of the first insulating layer 325A. The insulating layers 325 of other embodiments of this invention can also be a single-layered structure (not shown) or sandwiched at the intersections (not shown) of the first flexible wires 320A and 320B and the second flexible wires 330A and 330B.

Next, A plurality of first LEDs 360A are provided and mounted within each first sub-pixel 350A, whereby each of the first LEDs 360A having a fifth conductive pin 360A1 and a sixth conductive pin 360A2 on its non-emitting side (not shown). A plurality of second LEDs 360B are provided and mounted within each second sub-pixel 350B, whereby each of the second LEDs 360B having a seventh conductive pin 360B1 and an eighth conductive pin 360B2 on its non-emitting side (not shown). A plurality of third LEDs 360C are provided and mounted within each third sub-pixel 350C, whereby each of the third LEDs 360C having a ninth conductive pin 360C1 and a tenth conductive pin 360C2 on its non-emitting side (not shown). A plurality of fourth LEDs 360D are provided and mounted within each fourth sub-pixel 350D, whereby each of the fourth LEDs 360D having an eleventh conductive pin 360D1 and a twelfth conductive pin 360D2 on its non-emitting side (not shown).

The first LEDs 360A of this embodiment are red LED packages; the second LEDs 360B of this embodiment are green LED packages; the third LEDs 360C of this embodiment are blue LED packages; and the fourth LEDs 360D of this embodiment are yellow or white LED packages. The first LEDs 360A, the second LEDs 360B, the third LEDs 360C and the fourth LEDs 360D of other embodiments of this invention can be selected from LED packages emitting visible spectrum other than red, green, blue, yellow and white emission spectrum, and the arrangement of these LED packages can be adjusted as needed. Furthermore, the first LEDs 360A, the second LEDs 360B, the third LEDs 360C and the fourth LEDs 360D can also be replaced with red LED flip chips, green LED flip chips, blue LED flip chips and yellow or white LED flip chips, and the arrangement of these LED flip chips can also be adjusted as needed.

As illustrated in FIGS. 3B and 3C, the (e) row of the second flexible wire 330A has a fifth extension part 330A1 connected to a fifth conductive pad 345R1, and the (d) column of the first flexible wire 320A has a sixth extension part 320A1 connected to a sixth conductive pad 345R2, whereby the fifth conductive pin 360A1 of the first LED 360A is electrically connected to the (e) row of the second flexible wire 330A by connecting the fifth conductive pad 345R1 by means of a conductive glue 355 cured at a temperature lower than 250 degree C., and the sixth conductive pin 360A2 is electrically connected to the (d) column of the first flexible wire 320A by connecting the sixth conductive pad 345R2 by means of a conductive glue 355 cured at a temperature lower than 250 degree C.; the (e) row of the second flexible wire 230 has a seventh extension part 330A2 connected to a seventh conductive pad 345G1, and the (d+1) column of the first flexible wire 320B has an eighth extension part 320B1 connected to an eighth conductive pad 345G2, wherein the seventh conductive pin 360B1 of the second LED 360B is electrically connected to the (e) row of the second flexible wire 330A by connecting the seventh conductive pad 345G1 by means of a conductive glue 355 cured at a temperature lower than 250 degree C., and the eighth conductive pin 360B2 is electrically connected to the (d+1) column of the first flexible wire 320B by connecting the eighth conductive pad 345G2 by means of a conductive glue 2355 cured at a temperature lower than 250 degree C.; the (d) row of the second flexible wire 320A has a ninth extension part 320A2 connected to a ninth conductive pad 345B1, and the (e+1) column of the first flexible wire 330B has a tenth extension part 330B1 connected to a tenth conductive pad 345B2, wherein the ninth conductive pin 360C1 of the third LED 360C is electrically connected to the (e+1) row of the second flexible wire 330B by connecting the ninth conductive pad 345B1 by means of a conductive glue 355 cured at a temperature lower than 250 degree C., and the tenth conductive pin 360C2 is electrically connected to the (d) column of the first flexible wire 320A by connecting the tenth conductive pad 345B2 by means of a conductive glue 355 cured at a temperature lower than 250 degree C.; and the (e+1) row of the second flexible wire 330B has a eleventh extension part 330B2 connected to a eleventh conductive pad 345Y1, and the (d+1) column of the first flexible wire 320B has a twelfth extension part 320B1 connected to a twelfth conductive pad 345Y2, wherein the eleventh conductive pin 360D1 of the fourth LED 360D is electrically connected to the (e+1) row of the second flexible wire 330B by connecting the eleventh conductive pad 345Y1 by means of a conductive glue 355 cured at a temperature lower than 250 degree C., and the twelfth conductive pin 360D2 is electrically connected to the (d+1) column of the first flexible wire 320B by connecting the twelfth conductive pad 345Y2 by means of a conductive glue 355 cured at a temperature lower than 250 degree C. Furthermore, the conductive glue 355 can also be used together with an anisotropic conductive film (ACF) (not shown) or replaced with the anisotropic conductive film (ACF) (not shown) in other embodiments of this invention.

Accordingly, a flexible LED display with a high density array of this embodiment 4 can be easily manufactured by forming flexible wires on a transparent flexible substrate and mounting each of red, green, blue and yellow or white LED packages or flip chips in each of pixels defined by the flexible wires.

To sum up, this present invention provides a flexible LED display by utilizing flexible wires and the locations of the conductive pins on the bottom side of each single color LEDs or full color LEDs to make each of the single color LEDs or full color LEDs mount on each pixel defined by the flexible wires formed on the transparent flexible substrate.

Embodiment 5

In the embodiment of the invention, the substrate could be flexible or rigid. If the substrate is flexible, the wires are flexible. If the substrate is rigid, the wires could be flexible or rigid. In order to introduce the practice easily and clearly, the flexible substrate, the first flexible wires and the second flexible wires as mentioned above are also used in the embodiment.

In the embodiment, the first flexible wires and the second flexible wires are respectively formed on the opposite top and bottom surfaces of the flexible substrate. The manufacturing method may sputter, deposit or paste a conductive layer on the flexible substrate and then etch or cut by lasers the conductive layer to form the wires, or print the wires on the flexible substrate. Thereby, the insulating layers as mentioned above are not needed and replaced by the flexible substrate. The conductive pads as mentioned above, for example, are mounted on a surface of the flexible substrate. Conductive holes (not shown) are made to pass the flexible substrate, by filling the holes formed in the flexible substrate by a Computer Numerical Control machine (CNC) or lasers with conductive material. The conductive pads are electrically connected to the extension parts of the wires formed on the opposite surface of the flexible substrate by the conductive holes. In another embodiment, the conductive pads are electrically connected to the extension parts formed on the same surface of the flexible substrate and then the extension parts are electrically connected to their wires formed on the opposite surface of the flexible substrate by the conductive holes.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangement.

What is claimed is:

1. A light-emitting diode (LED) display, comprising:
   a substrate;
   a plurality of columns of first wires and a plurality of rows of second wires forming on the substrate, wherein the first wires cross the second wires to define a plurality of pixels, and the first wires and the second wires are insulated at the intersections of the first wires and the second wires;
   a plurality of LED packages each mounted within one of the pixels;
   a first circuit connected to the first wires;
   a second circuit connected to the second wires; and
   a driving circuit connected to the first circuit and the second circuit for controlling the LED packages.

2. The LED display of claim 1, wherein the substrate is flexible and selected from the group consisting of polyethylene terephthalate (PET), poly (methyl methacrylate) (PMMA), polyimide (PI), polycarbonate (PC), glass and combination thereof.

3. The LED display of claim 1, wherein the substrate is rigid and selected from the group consisting of polyethylene terephthalate (PET), poly (methyl methacrylate) (PMMA), glass and combination thereof.

4. The LED display of claim 1, wherein the first wires and the second wires are forming on the same surface of the substrate.

5. The LED display of claim 4, wherein the first wires and the second wires are on the same plane except at the intersections of the first wires and the second wires.

6. The LED display of claim 5, further comprising a plurality of insulating layers, sandwiched between the first wires and the second wires at the intersections of the first wires and the second wires.

7. A light-emitting diode (LED) display, comprising:
   a substrate;
   a plurality of columns of first wires and a plurality of rows of second wires formed on the substrate, wherein the first wires cross the second wires to define a plurality of pixels, and the first wires and the second wires are insulated at the intersections of the first wires and the second wires;
   a plurality of LED packages each mounted within one of the pixels;
   a first circuit connected to the first wires;
   a second circuit connected to the second wires; and
   a driving circuit connected to the first circuit and the second circuit;
   wherein the first wires and the second wires are respectively formed on the opposite surfaces of the substrate.

8. The LED display of claim 7, further comprising a plurality of conductive holes through the substrate, wherein the first wires or the second wires include a plurality of extension parts connected to the conductive holes.

9. The LED display of claim 7, further comprising a plurality of conductive pads and a plurality of conductive holes through the substrate, wherein the conductive pads are connected to the first wires or the second wires by the conductive holes.

10. A light-emitting diode (LED) display, comprising:
    a substrate;
    a plurality of columns of first wires and a plurality of rows of second wires formed on the substrate, wherein the first wires cross the second wires to define a plurality of pixels, and the first wires and the second wires are insulated at the intersections of the first wires and the second wires;

a plurality of LED packages each mounted within one of the pixels;

a first circuit connected to the first wires;

a second circuit connected to the second wires; and a driving circuit connected to the first circuit and the second circuit;

wherein adjacent three of the first wires and one of the second wires define one of the pixels.

11. The LED display of claim 10, wherein the pixel defined by adjacent three of the first wires and one of the second wires includes three sub-pixels each defined by one of the first wires and one of the second wires, one of the LED packages includes three LED units designed to each emit different emission spectrum, and the LED units are respectively mounted within the sub-pixels.

12. A light-emitting diode (LED) display, comprising:

a substrate;

a plurality of columns of first wires and a plurality of rows of second wires formed on the substrate, wherein the first wires cross the second wires to define a plurality of pixels, and the first wires and the second wires are insulated at the intersections of the first wires and the second wires;

a plurality of LED packages each mounted within one of the pixels;

a first circuit connected to the first wires;

a second circuit connected to the second wires; and a driving circuit connected to the first circuit and the second circuit;

wherein adjacent two of the first wires and adjacent two of the second wires define one of the pixels.

13. The LED display of claim 12, wherein the pixel defined by adjacent two of the first wires and adjacent two of the second wires includes four sub-pixels each defined by one of the first wires and one of the second wires, one of the LED packages includes four LED units designed to each emit different emission spectrum, and the LED units are respectively mounted within the sub-pixels.

* * * * *